United States Patent
Jacobsson et al.

(10) Patent No.: US 7,427,896 B2
(45) Date of Patent: Sep. 23, 2008

(54) DEVICE AND METHOD FOR PREDISTORTING AND INPUT SIGNAL

(75) Inventors: Peter Jacobsson, Lund (SE); Per Nordqvist, Lund (SE); Björn Gustavsson, Lund (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 96 days.

(21) Appl. No.: 10/542,157

(22) PCT Filed: Nov. 3, 2003

(86) PCT No.: PCT/EP03/11938

§ 371 (c)(1),
(2), (4) Date: Oct. 10, 2005

(87) PCT Pub. No.: WO2004/004248

PCT Pub. Date: Jul. 29, 2004

(65) Prior Publication Data

US 2006/0098757 A1    May 11, 2006

Related U.S. Application Data

(60) Provisional application No. 60/441,459, filed on Jan. 21, 2003.

(30) Foreign Application Priority Data

Jan. 13, 2003    (EP) .................................. 03000495

(51) Int. Cl.
*H03F 1/26* (2006.01)
(52) U.S. Cl. ...................................................... 330/149
(58) Field of Classification Search ............... 455/114.3
See application file for complete search history.

(56) References Cited

U.S. PATENT DOCUMENTS 6,741,867 B1 *   5/2004   Tetsuya ...................... 455/522
6,915,118 B2 *   7/2005   Matsuoka ................... 455/126

* cited by examiner

*Primary Examiner*—Steven J Mottola
(74) *Attorney, Agent, or Firm*—Potomac Patent Group PLLC

(57) ABSTRACT

A device, comprising a storage means (51) for storing phase change values, and a phase offset adding means (50) for predistorting an input signal at an amplifier means is disclosed. A controller means (52) is connected to the storage means (52) and the phase offset adding means (50). Said controller means (52) is adapted to retrieve phase change values from the storage means (51), and output an offset signal to the phase offset adding means (50), which is adapted to add said offset signal to the input signal. The invention also discloses a method for predistorting an input signal at an amplifier means (30) by retrieving phase change values from a look-up table stored in the storage means (30) in response to an indication to change the gain level of the amplifier means (30).

18 Claims, 5 Drawing Sheets

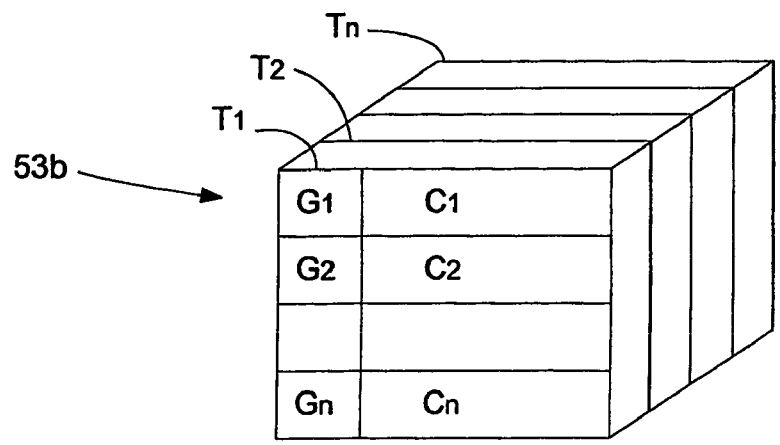
Fig. 3a
Fig. 3b
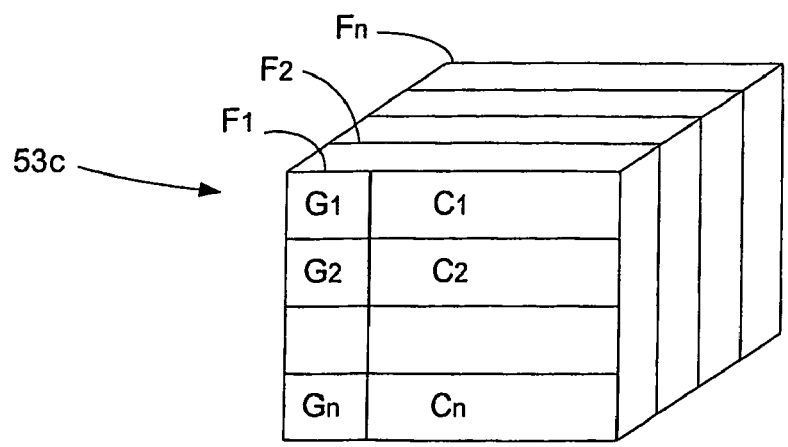
Fig. 3c

DEVICE AND METHOD FOR PREDISTORTING AND INPUT SIGNAL

This application claims the benefit of the filing date of U.S. Provisional Patent Application No. 60/441,459 filed on Jan. 21, 2003, and claims priority from European Patent Application No. 03000495-6 filed on Jan. 13, 2003. This application is a U.S. national stage application of International Application No. PCT/EP2003/011938.

TECHNICAL FIELD

The present invention relates to a device and a method for predistorting an input signal at an amplifier means of a transmitter chain. In particular, the invention relates to the compensation of phase jumps in the output power of an output signal caused by the changing of the power level of the output signal.

DESCRIPTION OF RELATED ART

In mobile communication several techniques for transmitting information from a mobile terminal, such as a mobile telephone, a pager, a communicator, i.e. an electronic organizer, a smartphone or the like, to a base station are available. The communication techniques include e.g. frequency division multiple access (FDMA), time division multiple access (TDMA), and code division multiple access (CDMA). One communication technology being based on the CDMA technology is the wideband code division multiple access (WCDMA) currently being employed for the universal mobile telecommunication system (UMTS) being developed within the third generation partnership project (3GPP).

In CDMA systems the over-the-air power control of the channel between the mobile terminal and the base station is a vital issue. An UMTS base station averages many channel estimates from a signal sent in different slots from a transmitter of a mobile terminal when it is possible, such as when the mobile is not moving or is moving very slow. This will give a large improvement of performance since the pilot symbol comprised in each slot of the signal from the mobile terminal is always very weak. One requirement for this to work is that the channel remains substantially constant despite that the mobile terminal changes its output power. The environment of the mobile terminal, and the distance between the mobile terminal and the base station effects the power level of the signal received by the base station. Also, the power received by the base station is dependent on the wanted data rate in the up-link. Therefore, the output power from the transmitter of the mobile terminal is changed for meeting the requirement that the power of the up-link channel from the mobile terminal should remain substantially constant when received by a base station. To provide the changing of the output power of the transmitter of the mobile terminal, said transmitter comprises an amplifier having variable gain. The gain of the variable gain amplifier may be changed in levels, so as to adjust the power of the output signal from the transmitter of the mobile terminal according to certain predetermined levels.

It has turned out that changing the output power of the variable gain amplifier is difficult without affecting the phase of the transmitted signal. Waveform generators known in the art generating the input signal to the variable gain amplifier can not compensate for phase jumps being synchronized with the output power change, which e.g. is described in the 3GPP specification TS 25.101. The link performance, i.e. the link between the mobile terminal and the base station, is degraded by the phase shift in the transmitter of the mobile terminal. Therefore, it is preferred to keep the phase-shift of the output power as low as possible when changing the power level.

SUMMARY OF THE INVENTION

It is an object of the invention to provide a device for compensating for phase-shifts in the output power of an output signal from a transmitter chain of an electronic equipment, such as a mobile terminal, a mobile telephone, a pager, or a communicator, said phase-shifts occurring as time discrete phase-jumps in response to changing the output power of the output signal. Another object of the invention is to provide a device capable of compensating for temperature dependent phase-shifts of the output power. Still another object of the invention is to provide a device capable of compensating for frequency or frequency band dependent phase-shifts of the output power. Also, it is an object of the invention that the compensation of the phase-shift will not be detrimental to the output power.

A device comprising a storage means and a phase offset adding means connected to a controller means achieves the above objects. The controller means is adapted to retrieve phase change values stored in a look-up table of the storage means. Based on first and second phase change values corresponding to a current and a new gain level of an amplifier means, the controller means is adapted to calculate a phase offset value. A signal comprising the phase offset value is supplied to the phase offset adding means, which is adapted to add the phase offset value to an input signal at the amplifier means.

In one embodiment, the phase offset signal is a complex value having a phase value corresponding to the calculated phase offset value. By synchronizing the adding of the phase offset signal to the input signal with the changing of the gain level of the amplifier means in a time gap between slots, wherein information data is transmitted, the adding of the phase offset signal will not be detrimental to the output power. The input signal is a base band signal generated by a waveform generator. The phase offset adding means of the device according to the invention is in one embodiment provided after first and second transmit filters of the waveform generator.

In another embodiment, said phase offset adding means is provided prior to said filters of the waveform generator. Further, the controller means is further adapted to receive an indication that the gain level of the amplifier means is to be changed, said indication comprising the current and the new gain levels of the amplifier means. Each phase change value of the storage means corresponds to the change of the phase of the output power of the amplifier means when the gain level of said amplifier means is changed from a first reference level, such as the lowest gain level, to a second predetermined gain level. Changing the gain level of the amplifier means will change the output power to a predetermined level. In alternative embodiments of the device according to the invention, said device comprises a temperature sensing means and/or a frequency indicator, wherein the device is adapted to compensate for temperature and/or frequency dependent phase-shifts.

Another object of the invention is to provide a method for compensating phase-shifts of an output signal from a transmitter chain of an electronic equipment, said phase-shifts occurring as time discrete phase-jumps in response to changing the output power of the output signal. Also, it is an object of the invention to provide a method for compensating for temperature dependent phase-shifts of the output signal. Still another object is to provide a method for compensating for frequency dependent phase-shifts of the output signal.

These objects are achieved by a method for predistorting an input signal at an amplifier means comprising the steps of: retrieving from a storage means phase change values; calculating a phase offset value based on the retrieved change values; and adding the phase offset value to the input signal. In an alternative embodiment a temperature or a temperature interval is derived, and temperature dependent phase change values are retrieved from the storage means, wherein a temperature dependent phase offset signal is added to the input signal. In still en alternative embodiment a frequency or frequency interval is derived, and frequency dependent phase change values are retrieved from the storage means, wherein a frequency dependent phase offset signal is added to the input signal.

It is another object of the invention to provide an electronic equipment capable of compensating for phase-shifts of the output power of an output signal from a transmitter chain of the electronic equipment, said phase-shifts occurring as time discrete phase jumps in response to changing the output power.

This object is achieved by an electronic equipment comprising the device according to the invention. In one embodiment, the equipment is a mobile terminal, a pager or a communicator. In another embodiment, the electronic equipment is a mobile telephone.

An advantage of the present invention is that it is possible to implement the device in the digital domain, wherein the electronic equipment will consume almost no extra power. Also, if the storage means is a rewritable memory, the stored phase change values may be altered in the future to meet technology changes in the communication system.

Further preferred features of the invention are defined in the dependent claims.

It should be emphasized that the term "comprises/comprising" when used in this specification is taken to specify the presence of stated features, integers, steps, components or groups thereof.

BRIEF DESCRIPTION OF THE DRAWINGS

In the following the present invention will be described in relation to some embodiments and accompanying drawings, in which:

FIG. 3a illustrates a first embodiment of a look-up table according to the invention;

FIG. 3b illustrates a second embodiment of a look-up table according to the invention;

FIG. 3c illustrates a third embodiment of a look-up table according to the invention;

DETAILED DESCRIPTION OF EMBODIMENTS

Various mobile communication systems utilize fixed base stations for communicating with mobile terminals via a wireless interface. Such systems include code division multiple access (CDMA) systems, such as the wide band multiple access (WCDMA) system employed in the universal mobile telecommunication system (UMTS).

Figure 1:
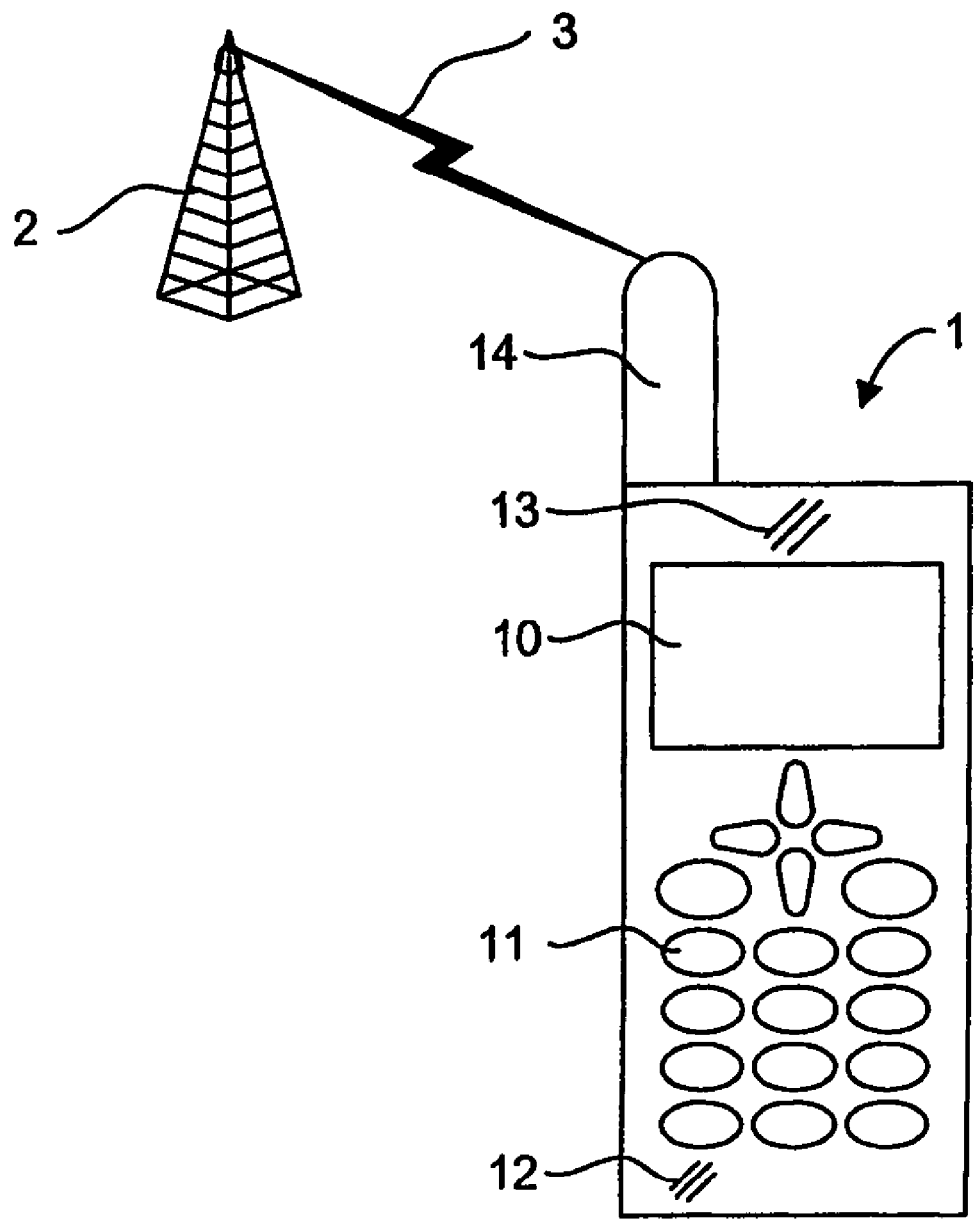
FIG. 1 illustrates a mobile terminal comprising the device according to the invention, and a base station.

FIG. 1 illustrates an electronic equipment embodied as a mobile terminal 1, which according to the invention comprises a device 46 for predistorting an input signal at an amplifier of a transmitter chain of the mobile terminal 1. The device of the invention is adapted to add a phase offset to the input signal in response to a change of the output power of the mobile terminal. As is understood, the electronic equipment may take other forms, such as a mobile telephone, a pager, or a communicator, without departing from the scope of the invention. However, for convenience reference will be made to a mobile terminal 1 throughout this description. Further, the mobile communication system comprises at least one base station 2, with which the mobile terminal 1 may communicate speech and data according to a predetermined protocol over a wireless link 3. The mobile terminal 1 comprises a man machine interface, with which a user of the mobile terminal 1 may operate said terminal. The man-machine interface may comprise, but is not limited to, a display 10, a keypad 11, a microphone 12, and a loudspeaker 13. Further, the mobile terminal comprises an antenna 14 for transmitting signals to the base station 2. The antenna 14 is connected to the transmitter chain within the mobile terminal 1.

Figure 2:
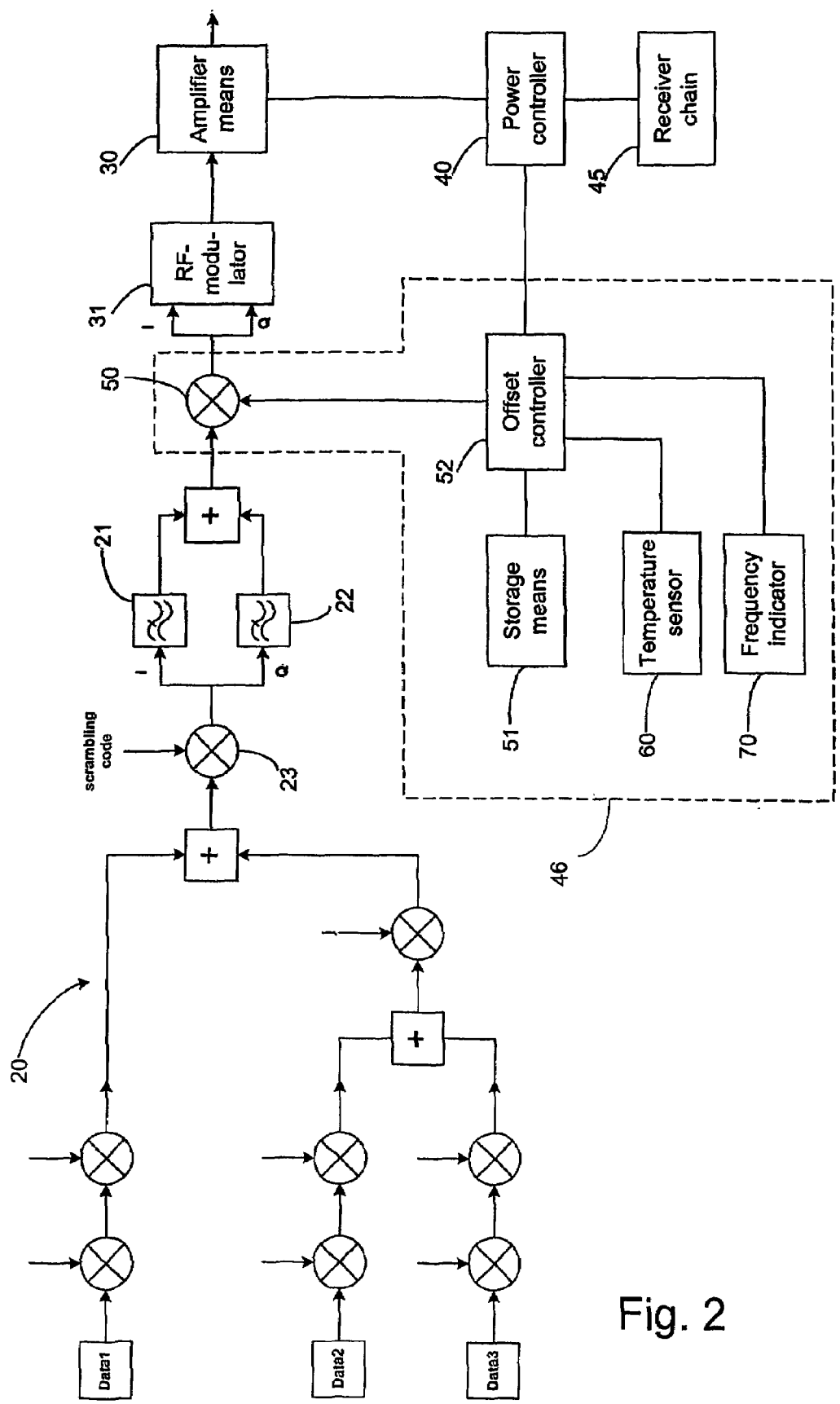
FIG. 2 is a block diagram of a wave form generator connected to the device according to the invention.

FIG. 2 illustrates a waveform generator 20 being part of the transmitter chain of the mobile terminal 1 comprising the device according to the present invention. The waveform generator 20 comprises first and second transmitter filters 21, 22 for filtering the in-phase (I) component and the quadrature (Q) component of a base band signal, respectively. Further, a first mixer 23 is provided prior to the filters 21, 22 for mixing the base band signal with the scrambling code of the mobile terminal 1. The waveform generator 20 is adapted to generate a base band signal to be supplied as the input signal to an amplifier means 30 via a RF (radio frequency) modulator 31.

To provide changing of the output power of the output signal of the transmitter chain the amplifier means 30 is in one embodiment a variable gain amplifier (VGA). The gain of the variable gain amplifier may e.g. be set according to predetermined levels in order to set the output power level of the transmitter to meet requirements of different specifications. Power levels and classes are e.g. specified in the third generation partnership project (3GPP) specification TS 25.101, which is incorporated herein by reference. However, the exact number of power classes or power levels of the output power is not important for the present invention, wherein any number of classes or levels may be implemented.

A power controller 40 sets the gain levels of the amplifier means 30 to keep the output power at a desired level. Consequently, the power controller 40 is connected to the amplifier means 30 to control the output power of the amplifier means in any number of predetermined levels. The exercise of the control of the gain levels of the amplifier means 30 to adjust the output power may be executed in a number of different ways. In open loop power control, the mobile terminal 1 determines an estimate of the path loss between the base station 2 and the mobile terminal 1 by measuring the received signal strength at the mobile terminal 1. An automatic gain control (AGC) circuitry (not shown) within a receiver chain 45 of the mobile terminal 1 provides a rough estimate of the propagation loss for each mobile terminal 1. The smaller the received power the larger the propagation loss, and vice versa. The transmit power, i.e. the output power, of the mobile terminal 1 is in one embodiment determined from the equation:

mean output power (dBm)=−mean input power (dBm)+offset power+parameters.

The offset power is e.g. −73 dB for the 800 MHz band mobile terminal and −76 dB for the 1900 MHz mobile terminals in the IS-95 standard (US CDMA system).

The desired output power level is then supplied by the receiver chain 45 to the power controller 40. The parameters are used to adjust the open loop power control for different cell sizes and different cell effective radiated powers (ERP) and receiver sensitivities. The parameters are initially transmitted on the synchronization channel between the mobile terminal 1 and the base station.

In another embodiment closed loop power control is utilized, wherein a transmit power control (TPC) command is received in the downlink by the receiver chain 45 of the mobile terminal 1. Said command is derived by the base station 1 based on the received signal strength of the signal from a specific mobile terminal 1. The power controller 40 is connected to the receiver chain 45 in order to receive the TPC commands and set the gain level of the amplifier means 30 accordingly. The receiver chain 45 does not form any part of the present invention, and is therefore not further disclosed herein. In one embodiment of the invention, the power controller 40 forms part of the amplifier means 30.

As discussed above, the change of the gain level of the amplifier means 30, and consequently the output power, will add a phase-shift to the output power of the output signal from the amplifier means 30. The phase-shift will occur as a time discrete phase-jump of the output power in response to the change of the output power. To compensate for such phase-shifts, a phase offset signal is added to the base band signal, which is generated by the waveform generator, by means of the device 46 according to the invention for predistorting the input signal at the amplifier means 30. In one embodiment, the phase offset signal is a complex value having amplitude corresponding to 1 and a phase value corresponding to a phase offset value, which will be described below. Therefore, the device 46 comprises a phase offset adding means 50, such as a digital multiplier or a complex multiplier, that mixes the base band signal from the waveform generator 20 with the phase offset signal. In the embodiment illustrated in FIG. 2, the phase offset adding means 50 is provided after the waveform generator, i.e. after the first and second transmitter filters 21, 22. However, in alternative embodiment, the phase offset adding means 50 is a part of the waveform generator 20, wherein the phase offset adding means 50 is provided before the transmit filters 21, 22. As is understood, also other positions of the phase offset adding means 50 is possible within the scope of the invention, as long as the phase offset may be added to the input signal at the amplifier means 30.

The device 46 according to the invention further comprises a storage means 51 and an offset controller 52. The storage means 51 is in one embodiment a memory, wherein at least one value of the change of the phase of the output power for different gain levels of the amplifier means 30 is stored in a look-up table 53*a*, as will be further explained in the following. In one embodiment, the storage means 51 is a rewritable memory, wherein the phase change values stored in said memory may be substituted. In another embodiment, the storage means 51 is a read only memory (ROM), wherein the values of the look-up table 53*a* are stored by the manufacturer of the mobile terminal 1 according to a predetermined specification.

FIG. 3*a* illustrates a first embodiment of the look-up table 53*a* stored in the storage means 51. The look-up table 53*a* comprises columns, wherein different gain levels $G_i$ ($G_i = G_1 \ldots G_n$) of the amplifier means 30 is stored in a first column, and phase change values $C_i$ ($C_i = C_1 \ldots C_n$) associated with each gain level are stored in a second column. Consequently, phase change value $C_1$ corresponds to a change of the phase of the output power when the gain is changed from gain level $G_0$ to gain level $G_1$ etc. A phase change value will not be stored for the lowest gain level $G_0$. In one embodiment, each phase change value is a digital phase value, which may be retrieved by the offset controller 52. Consequently, the storage means 51 is connected to the offset controller 52 being connected to the power controller 40. In an alternative embodiment, the power controller 40 and the offset controller 52 are provided as one controller providing the functions of the separate controllers 40, 52.

When it is decided that the gain level of the amplifier means 30 should be changed, i.e. increased or decreased as indicated by the open or closed loop power control as described above, the power controller 40 transmits a gain control signal to the amplifier means 30 instructing said amplifier means 30 to change its gain level. Also, the power controller 40 transmits a gain change indication signal to the offset controller 52 indicating that the gain of the amplifier means 30 is to be changed. The gain change indication signal comprises information of the new gain level of the amplifier means 30. In response thereto, the offset controller 52 retrieves from the storage means 51 the phase change values corresponding to the new gain level by addressing the storage means by means of the new gain level. Then, the phase offset value is outputted, as will be explained below.

In an alternative embodiment the output power, and consequently the gain level, of the amplifier means 30 is compensated for temperature dependent phase-shifts in connection with the gain level dependent phase-shift. Therefore, a temperature sensing means 60, such as a temperature sensor, is connected to the offset controller 52.

FIG. 3*b* illustrates one embodiment of a second look-up table 53*b* comprising phase change values being dependent on the gain level of the amplifier means 30 as well as the temperature. The temperature may be divided into different temperature intervals $T_i$, such as 0-5° C., 5-10° C. etc., to limit the needed storage space. The specific number of temperature intervals ($T_1 \ldots T_n$) has to be tested and evaluated in each specific case. As in the embodiment illustrated in FIG. 3*a*, the look-up table 53*b* comprises columns, wherein different gain levels of the amplifier means 30 is stored in a first column, and the associated phase change value is stored in a second column. However, here the look-up table 53*b* comprises a third dimension, wherein the gain levels $G_i$ and the associated phase change values $C_i$ are stored for each temperature interval $T_i$. In this embodiment, the offset controller 52 has to provide both information of the second, i.e. the new, gain level of the amplifier means 30 as well as temperature information to the look-up table 53*b* to retrieve the correct phase change value, wherein the temperature value or the temperature interval value is an index to address the look-up table 53*b* together with the new gain level.

In another embodiment, the device 46 according to the invention compensates for frequency dependent phase-shifts or frequency band dependent phase-shifts of the output signal of the amplifier means 30. In this embodiment, the device 46 according to the invention comprises a frequency indicator 70 connected to the offset controller 52, which may divide each specific frequency into different frequency intervals $F_i$ ($F_i = F_1 \ldots F_n$). The frequency indicator indicates the operating frequency and/or the operating frequency band of the mobile terminal 1. FIG. 3c, illustrates a look-up table 53c comprising data having phase shift change values $C_i$ depending on both gain level $G_i$ of the amplifier means 30 as well as the frequency intervals $F_i$. In this embodiment, the offset controller 52 has to provide both information of the first and second gain levels of the amplifier means 30 as well as frequency interval information to the look-up table 53b to retrieve the correct phase change values, wherein the frequency value or the frequency interval value is an index to address the look-up table 53c together with the new gain level of the amplifier means 30.

In still another embodiment the device 46 according to the invention compensates both for frequency dependent and temperature dependent phase-shifts in addition to gain level dependent phase-shifts. In this embodiment, a number of look-up tables are provided, wherein each table corresponds to either the embodiment shown in FIG. 3b or 3c, and being valid in a specific temperature interval or a specific frequency interval. The specific look-up table may be addressed, by means of the temperature interval or the frequency interval information, to accessing the specific phase change values corresponding to certain first and second gain levels and a certain temperature interval or frequency interval.

The phase change values to be stored in the storage means 51 may be defined according to the steps illustrated in the flow chart of FIG. 4 and described in the following:

First, in step 100 supply an input signal generated by a waveform generator 20 without any phase offset adding means 50 according to the invention, or with the phase of phase offset set to 0, to the amplifier means 30 being set to the lowest gain level $G_0$. Keep the temperature constant at a predetermined level, such as room temperature.

In step 101, measure and temporarily store the phase of the output power from the amplifier means 30 to provide a phase reference value.

In step 102, increase the output power with a predefined value, such as 1 dB, by increasing the gain level of the amplifier means 30.

Then, in step 103 measure the phase of the output power from the amplifier means 30.

In step 104, calculate the value of the change in phase, between the changed phase measured in step 103 and the phase reference value calculated in step 101, and store said change value in the look-up table 53a of the storage means 51 at the gain level set in step 102 as a corresponding phase change value $C_i$. Consequently, increasing the gain level from the first, or lowest, gain level $G_0$ to the second gain level $G_1$ will generate a first phase change value $C_1$ corresponding to the second gain level $G_1$.

In step 105, decide whether the gain level of the amplifier means 30 has reached its highest gain level $G_n$. If not, the procedure is returned to step 102 to derive a subsequent phase change value $C_{i+1}$. However, if the decision in step 105 if affirmative, in step 106 the procedure is ended.

Figure 4:
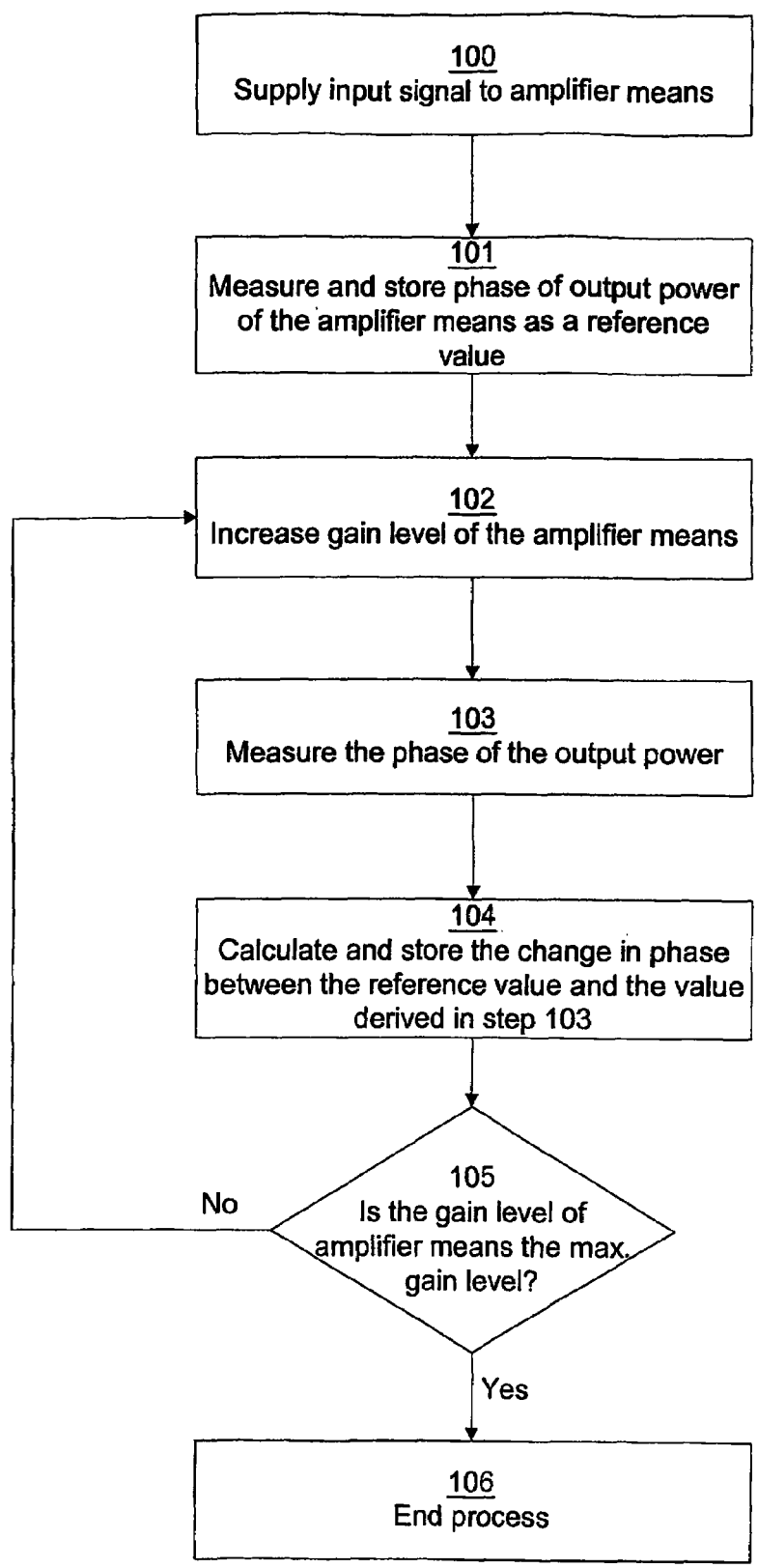
FIG. 4 is a flow chart of a method for deriving phase change values stored in any of the look-up tables illustrated in FIG. 3a-3c.

The method illustrated in steps 100-106 of FIG. 4 may be repeated for different temperatures or temperature intervals, wherein the temperature chosen is preferably in the middle of the temperature interval if temperature dependent phase offset signals should be provided. This will generate a look-up table 53b according to FIG. 3b. As is understood, the method in step 100-106 may also be repeated for different operating frequencies or operating frequency intervals of the mobile terminal 1, wherein the operating frequency is kept constant throughout one cycle, 100-106. The chosen operating frequency in each frequency interval is preferably chosen in the middle of the frequency interval. The procedure is then repeated for any required operating frequency or frequency interval. Also, the procedure in FIG. 4 may equally be repeated for different temperature intervals and frequency intervals to generate change phase change values being both frequency and temperature dependent.

In CDMA technology information data is sent to the base station 2 in slots having a small time gap between subsequent slots. During the time gap no information data is transmitted to the Base station. The control of the gain level of the amplifier means 30 is preferably executed during the time gap as the changing of the gain level will generate a small transient in the output signal although the phase offset signal is added to the input signal. However, if the changing of the gain level of the amplifier means 30 and the adding of the phase offset signal to the input signal at the amplifier means 30 is synchronized during the time gap the transient will not be detrimental, as no information data is transmitted.

Figure 5:
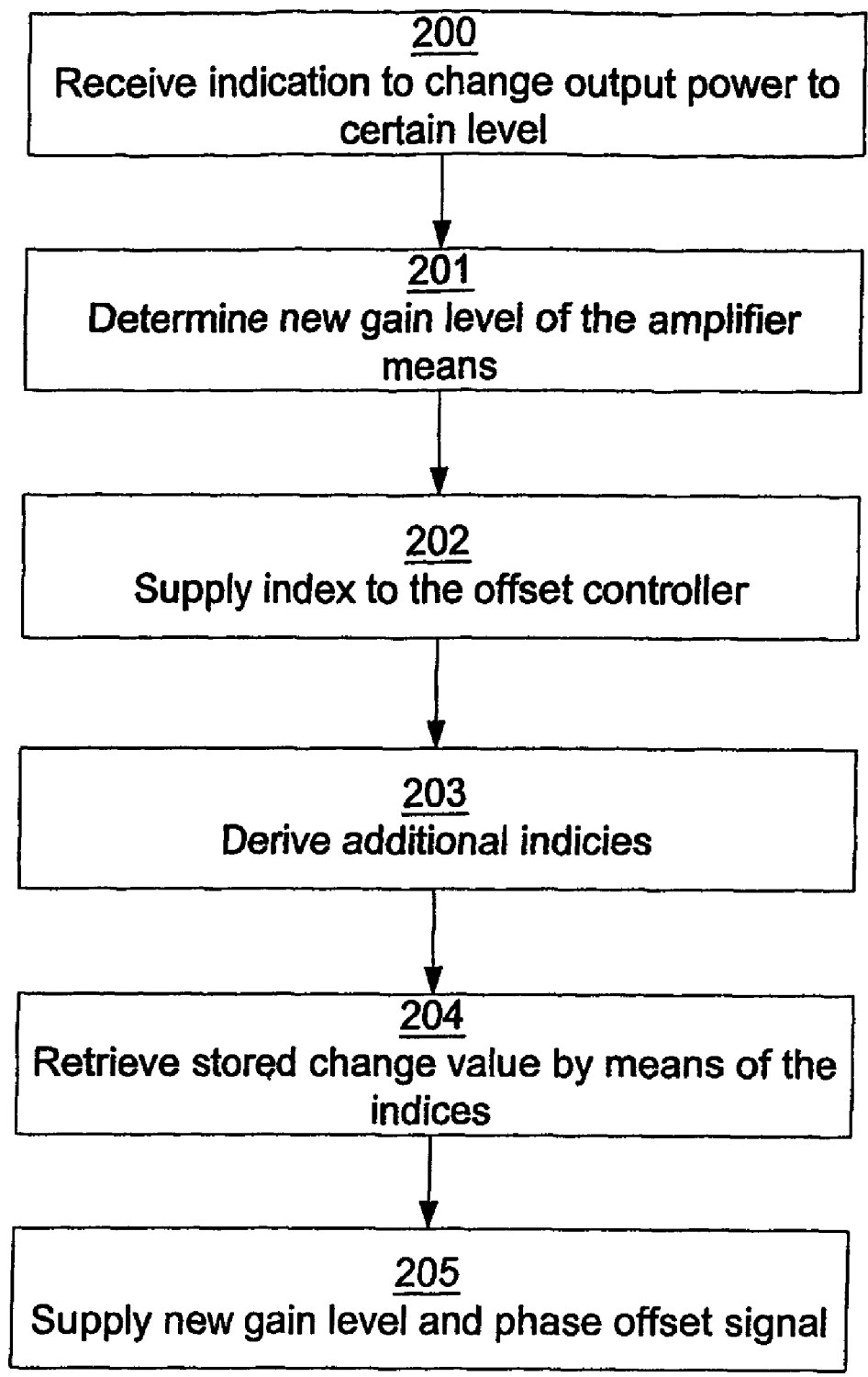
FIG. 5 is a flow-chart of a method according to the invention for adding a phase offset signal to the input signal at an amplifier means.

FIG. 5 illustrates the method for predistorting the input signal according to the invention for compensating for phase changes due to a gain level change of the amplifier means 30. In the preferred embodiment, the steps according to the method are executed in the time gap wherein no transmission of information data is provided. The needed phase compensation of the input signal at the amplifier means 30 is calculated by the offset controller 52 and supplied as the phase offset signal to the phase offset adding means 50. In a first step 200, an indication to change the output power to a certain level, such as the TPC command, is received by the power controller 40. In step 201, the new gain level of the amplifier means 30 is determined based on the indication received in step 200. In step 202, in response to determining the new gain level, or changing the gain level, the new gain level of the amplifier means 30 is indicated by the power controller 40, i.e. supplied to the offset controller 52, which will be an index for addressing the lookup-table 53a of the storage means comprising gain levels and associated phase values. Each gain level stored in the look-up table have an associated phase value. Therefore, the offset controller 52 will retrieve a phase value corresponding to the new gain level of the amplifier means 30.

In step 203, if the offset signal should compensate for temperature and/or frequency dependent phase-shifts, the offset controller 52 obtains the temperature supplied by the temperature sensing means 60, and/or the frequency or the frequency band supplied by the frequency indicator 70. Then, the temperature interval and/or the frequency interval may be derived. If the temperature and/or frequency are not needed, step 203 is omitted. Then, in step 204 the new gain level of the amplifier means 30 together with the frequency/frequency interval and/or the temperature/temperature interval are used to address the storage means 51 to retrieve an associated temperature/frequency dependent phase value, i.e. a change value $C_i$, which corresponds to the new gain level. The new gain level, possibly together with the temperature (or temperature interval) and the frequency (or frequency interval or band), acting as an index to address the look-up table 53a, 53b, 53c are supplied to the storage means 51, which returns the demanded phase change value. However, if the new gain level of the amplifier means 30 is the basic gain level, no change value needs to be retrieved, as the change value relating to the basic gain level is known to be zero. However, as is understood, a change value may also be stored for the basic gain level. Finally, in step 205 the power controller 40 supplies the new gain level to the amplifier means 30, which will provide the output power level indicated by the change indicator. Also, the offset controller 52 supplies the value of the phase offset signal to the phase offset adding means 50, which will add said offset to the input signal generated by the waveform generator. If the gain level is changed and the value of the phase offset signal is added to the input signal at the amplifier means 30 during the time gap, no detrimental phase jump will be added to the output signal from the mobile terminal 1.

The present invention has been described in some embodiments. However, the scope of the invention should not be limited to the above-described embodiments, but is best defined by the following independent claims. Furthermore, the term "comprising" does not exclude other elements or steps, the terms "a" and "an" do not exclude a plurality and a single processor or other unit may fulfill the functions of several of the units recited in the claims. The function of the offset controller 52 may e.g. be implemented as software comprising computer readable instructions for carrying out the functions of said controller when executed by a processing unit, such as the central processing unit of the mobile terminal 1.

The invention claimed is:

1. A device for predistorting an input signal at an amplifier means, comprising a storage means, an offset adding means, and a controller, wherein
the storage means is adapted to store phase values;
the offset adding means is a phase offset adding means for phase-shifting the input signal,
the storage means and the phase offset adding means are connected to the controller, which is adapted to retrieve at least one phase value from the storage means, and output an offset signal comprising the retrieved phase value to the phase offset adding means, which is adapted to add said offset signal to the input signal, and the storage means comprise a lookup table comprising different gain levels and associated phase values, and the controller is adapted to retrieve a phase value from the storage means corresponding to a given gain level of the amplifiers means.

2. A device for predistorting an input signal at an amplifier means, comprising a storage means, an offset adding means, and a controller, wherein
the storage means is adapted to store phase values;
the offset adding means is a phase offset adding means for phase-shifting the input signal,
the storage means and the phase offset adding means are connected to the controller, which is adapted to retrieve at least one phase value from the storage means, and output an offset signal comprising the retrieved phase value to the phase offset adding means, which is adapted to add said offset signal to the signal, and the storage means is a memory comprising a look-up table comprising phase values relating to the change of the gain level of an amplifier means from a first gain level to one or more additional gain levels.

3. The device according to claim 2, wherein the memory is rewritable.

4. The device according to claim 1, wherein the phase offset adding means is a complex multiplier.

5. A device for predistorting an input signal at an amplifier means, comprising a storage means, an offset adding means, and a controller, wherein
the storage means is adapted to store phase values;
the offset adding means is a phase offset adding means for phase-shifting the input signal,
the storage means and the phase offset adding means are connected to the controller, which is adapted to retrieve at least one phase value from the storage means, and output an offset signal comprising the retrieved phase value to the phase offset adding means, which is adapted to add said offset signal to the input signal, and each phase value stored in the storage means corresponds to a change in phase of the output power when the gain level of the amplifier means is changed from a first gain level to a second gain level.

6. The device according to claim 5, wherein the first gain level is the lowest gain level, and the second gain level is any other gain level of the amplifier means.

7. A device for predistorting an input signal at an amplifier means, comprising a storage means, an offset adding means, and a controller, wherein
the storage means is adapted to store phase values;
the offset adding means is a phase offset adding means for phase-shifting the input signal,
the storage means and the phase offset adding means are connected to the controller, which is adapted to retrieve at least one phase value from the storage means, and output an offset signal comprising the retrieved phase value to the phase offset adding means, which is adapted to add said offset signal to the input signal, and
the device further comprises a temperature sensing means connected to the controller for deriving a temperature or a temperature interval, and the storage means comprises a lookup table comprising gain levels and associated phase values for different temperatures or different temperature intervals, and the controller is adapted to retrieve a temperature dependent phase value from the storage means corresponding to a temperature or temperature interval and a given gain level of the amplifier means.

8. A device for predistorting an input signal at an amplifier means, comprising a storage means, an offset adding means, and a controller, wherein
the storage means is adapted to store phase values;
the offset adding means is a phase offset adding means for phase-shifting the input signal,
the storage means and the phase offset adding means are connected to the controller, which is adapted to retrieve at least one phase value from the storage means, and output an offset signal comprising the retrieved phase value to the phase offset adding means, which is adapted to add said offset signal to the input signal, and
the device further comprises a frequency indicator for deriving an operating frequency value or an operating frequency interval value, and the storage means comprises a lookup table comprising gain levels and associated phase values for different frequencies or different frequency intervals, and the controller is adapted to retrieve a frequency dependent phase value from the storage means corresponding to a frequency or frequency interval and a given gain level of the amplifier means.

9. A method for predistorting an input signal at an amplifier means including a storage means, comprising the steps of:
retrieving a phase value from a lookup table of the storage means in response to changing a gain level of the amplifier means; and
adding an offset signal having a phase value corresponding to the retrieved phase value to said input signal;
wherein the step of retrieving further comprises the steps of:
receiving a new gain level of the amplifier means; and
retrieving a phase value associated with the new gain level from the look-up table of the storage means.

10. A method for predistorting an input signal at an amplifier means including a storage means, comprising the steps of:

retrieving a phase value from a lookup table of the storage means in response to changing a gain level of the amplifier means; and adding an offset signal having a phase value corresponding to the retrieved phase value to said input signal;

wherein the phase value corresponding to a basic gain level is zero.

11. The method according to claim 9, wherein the step of retrieving further comprises the steps of:

obtaining a temperature value or a temperature interval value; and retrieving a temperature dependent phase value associated with the new gain level and the temperature or temperature interval from the lookup-table of the storage means.

12. The method according to claim 9, wherein the method comprises the further steps of:

obtaining a frequency value or a frequency interval value; and retrieving a frequency dependent phase value associated with the new gain level and the frequency or frequency interval from the look-up table of the storage means.

13. The device according to claim 1, wherein the device is a mobile terminal, a pager, or a communicator.

14. The device according to claim 1, wherein the device is a mobile telephone.

15. The device according to claim 2, wherein the phase offset adding means is a complex multiplier.

16. The device according to claim 5, wherein the phase offset adding means is a complex multiplier.

17. The device according to claim 7, wherein the phase offset adding means is a complex multiplier.

18. The device according to claim 8, wherein the phase offset adding means is a complex multiplier.

* * * * *

UNITED STATES PATENT AND TRADEMARK OFFICE
CERTIFICATE OF CORRECTION

PATENT NO. : 7,427,896 B2 Page 1 of 1
APPLICATION NO. : 10/542157
DATED : September 23, 2008
INVENTOR(S) : Jacobsson et al.

It is certified that error appears in the above-identified patent and that said Letters Patent is hereby corrected as shown below:

On the Title Page, in Field (54), in Title, in Column 1, Line 2, delete "AND" and insert -- AN --, therefor.

On the Title Page, in Field (87), under "PCT Pub. No.", in Column 1, Line 1, delete "WO2004/004248" and insert -- WO2004/064248 --, therefor.

In Column 1, Line 2, delete "AND" and insert -- AN --, therefor.

In Column 9, Line 33, in Claim 1, delete "comprise" and insert -- comprises --, therefor.

In Column 9, Line 37, in Claim 1, delete "amplifiers" and insert -- amplifier --, therefor.

In Column 9, Line 49, in Claim 2, delete "the signal" and insert -- the input signal --, therefor.

Signed and Sealed this

Twenty-seventh Day of October, 2009

David J. Kappos
*Director of the United States Patent and Trademark Office*